US006989552B2

(12) United States Patent
Goodwin et al.

(10) Patent No.: US 6,989,552 B2
(45) Date of Patent: Jan. 24, 2006

(54) METHOD FOR MAKING AN INTEGRATED CIRCUIT DEVICE WITH DIELECTRICALLY ISOLATED TUBS AND RELATED CIRCUIT

(75) Inventors: Charles Arthur Goodwin, Wyomissing, PA (US); Daniel David Leffel, Boyertown, PA (US); William Randolph Lewis, Reading, PA (US)

(73) Assignee: Agere Systems Inc., Allentown, PA (US)

( * ) Notice: Subject to any disclaimer, the term of this patent is extended or adjusted under 35 U.S.C. 154(b) by 92 days.

(21) Appl. No.: 10/272,734

(22) Filed: Oct. 17, 2002

(65) Prior Publication Data

US 2003/0034526 A1     Feb. 20, 2003

Related U.S. Application Data

(62) Division of application No. 09/728,448, filed on Dec. 1, 2000, now Pat. No. 6,500,717.

(51) Int. Cl.
 *H01L 27/108*     (2006.01)
(52) U.S. Cl. .......................... 257/69; 257/93; 257/126; 257/127; 257/374
(58) Field of Classification Search ........ 438/296–977; 257/51, 374–377, 505–510, 329, 139, 341, 257/401
 See application file for complete search history.

(56) References Cited

U.S. PATENT DOCUMENTS

| 3,571,919 | A | | 3/1971 | Gleim et al. |
| 5,114,875 | A | | 5/1992 | Baker et al. |
| 5,206,182 | A | | 4/1993 | Freeman |
| 5,362,669 | A | | 11/1994 | Boyd et al. |
| 5,511,428 | A | * | 4/1996 | Goldberg et al. ............. 73/777 |
| 5,618,751 | A | * | 4/1997 | Golden et al. ............. 438/392 |
| 6,121,148 | A | * | 9/2000 | Bashir et al. ............... 438/692 |
| 6,500,717 | B2 | * | 12/2002 | Goodwin et al. ........... 438/296 |
| 6,794,708 | B2 | * | 9/2004 | Mori .......................... 257/314 |

OTHER PUBLICATIONS

Stanley Wolf, PhD., "Silicon Processing for the VLSI Era"; vol. 2, Process Integration; pp. 67-69; Lattice Press, Sunset Beach, Ca., USA.

\* cited by examiner

*Primary Examiner*—Fetsum Abraham

(57) ABSTRACT

A method for making an integrated circuit includes forming spaced-apart trenches on a surface of a single crystal silicon substrate, lining the trenches with a silicon oxide layer, forming a first polysilicon layer over the silicon oxide layer, forming a second polysilicon layer over the first polysilicon layer, and removing a thickness of the single crystal silicon substrate to expose tubs of single crystal silicon in the second polysilicon layer.

11 Claims, 5 Drawing Sheets

METHOD FOR MAKING AN INTEGRATED CIRCUIT DEVICE WITH DIELECTRICALLY ISOLATED TUBS AND RELATED CIRCUIT

This Application is a Divisional of prior application Ser. No. 09/728,448 filed on Dec. 1, 2000, now U.S. Pat. No. 6,500,717, to Charles A. Goodwin, et al. The above-listed Application is commonly assigned with the present invention and is incorporated herein by reference as if reproduced herein in its entirety under Rule 1.53(b).

FIELD OF THE INVENTION

The present invention relates generally to the field of semiconductor devices, and, more particularly, to dielectrically isolated substrates.

BACKGROUND OF THE INVENTION

A large number of integrated circuit (IC) devices may be formed on a single wafer or substrate of semiconductor material. Each substrate is a thin slice of a single crystal semiconductor material such as silicon. The successful formation of viable IC devices requires the use of a correctly formed and processed substrate. An individual substrate may undergo steps of rough polishing and chemical-mechanical polishing (CMP) to remove surface damage caused by substrate slicing, to achieve a desired thickness, and to produce a substantially flat and planar surface on the substrate. The substrate edges may also be ground to a rounded configuration.

Typically, an initial step in forming IC devices on a silicon substrate is oxidation of the surface, such as to silicon dioxide $SiO_2$, for example. The $SiO_2$ provides a hard, electrically insulating layer which also serves to protect the substrate surface from physical damage and contamination. The formation of IC devices on a substrate normally includes many steps, most of which may be classified in the broad categories of layering, patterning, doping, and heat treatment. Every type of semiconductor chip requires some type of isolation in order for the individual devices (e.g., transistors, capacitors, resistors, etc.) to operate independently of one another, or to operate in environments of high radiation.

Many of the defects which occur in substrate and chip manufacture are related to inadequate dielectric isolation. Because of the drive toward integrated circuit devices with greater density and complexity, individual components must be made increasingly smaller and placed closer together. In some applications, operation at higher voltages or in high radiation environments is required. Thus, the need for electrical isolation and radiation isolation become of much greater significance.

One conventional method of forming a dielectrically isolated (DI) substrate for manufacturing bipolar and metal-oxide-semiconductor (MOS) devices will now be described. A prior art substrate is conventionally formed as a slice of a single crystal silicon material, and typically is subjected to grinding, polishing and surface oxidation steps to form a smooth planar first substrate surface. The first substrate surface is etched in a V-groove etching method well-known in the art. The etched depressions are known as trenches, troughs, or pockets, and may be formed by an isotropic wet etch or an anisotropic dry etch. In this application, the etched depressions will be referred to as trenches.

The side surfaces and bottom surfaces of the trenches and the non-trenched surfaces are oxidized to form a layer of silicon dioxide over the surfaces of the trenches and the non-trenched surfaces. This oxide layer is the isolation barrier. A thick layer of polysilicon is deposited over the oxide layer (i.e. the isolation barrier). The polysilicon layer backfills the trenches and non-trenched portions of the first substrate surface, forming a "handle" or layer for supporting the substrate and devices formed thereon. The substrate is lapped or removed from its second surface until the oxide layer is reached.

A substantial portion of the original silicon is removed, leaving a smoothed polysilicon substrate surface including oxide-isolated tubs or islands of the original single crystal silicon material. The exposed surface of each tub has an active surface. Circuit components may be fabricated on the active surfaces of the silicon tubs. The completed substrate with circuit components thereon may be cut or singulated into discrete chips which are packaged for the intended use.

The manufacture of DI devices has presented several drawbacks. First, unless the etching steps are carried out very carefully, the final working surface of the substrate may not be as planar as the original substrate. This affects subsequent processes, especially lithography, and may produce islands or tubs with varying thicknesses. Another problem in DI device manufacture has been the formation of pinholes and other defects in the isolation barrier (i.e., the oxide layer). Such pinholes cause current leakage to occur in both normal and high radiation environments, effectively negating the purpose of the isolation barrier. Thus, integrated circuits manufactured with the DI method have additional risks of reduced performance and poorer reliability.

Current leakage defects present a major problem in the manufacture of DI substrates and are largely due to the presence of contaminants in or on the surface of the oxide layer which become activated upon application of the polysilicon layer. The unit production cost of DI devices has been relatively high, largely because of the resulting low substrate yield.

An early form of isolating a substrate is described in U.S. Pat. No. 3,571,919 to Gleim et al. The patent discloses depositing a layer of silicon carbide over mesas which, after etching become individual islands of single crystal silicon isolated by the carbide layer. The use of silicon dioxide as an isolation barrier became well-known, as indicated in U.S. Pat. No. 5,114,875 to Baker et al. This reference addresses the formation of metal conductors spanning the isolation barrier.

In U.S. Pat. No. 5,206,182 to Freeman, a trench isolation process is used to form electronic circuits surrounded on lateral sides by air-filled trenches. In intermediate steps of fabrication, the inner and outer walls of the trenches are coated with a silicon dioxide layer and covered with a layer of silicon nitride. The trenches extend downwardly to a level at or below a buried layer.

None of the above references address the problem of pin-hole formation and resulting current leakage in DI substrates when a silicon dioxide isolation barrier is covered with polysilicon. One attempted approach has been to decontaminate the polysilicon deposition chambers more frequently, i.e., between each batch. This has not substantially reduced contamination. Furthermore, such frequent cleaning is time-consuming and expensive.

SUMMARY OF THE INVENTION

An object of the present invention is to provide a method for more readily fabricating high quality dielectrically isolated (DI) substrates for producing silicon-on-insulator (SOI) devices such as bipolar and metal-oxide semiconductors (MOS) and the like, including the numerous variants thereof.

Another aspect of the object is to produce DI devices at higher yields.

A further object of the invention is to provide DI substrates with enhanced dielectric isolation, thereby enabling the reduction of component separation (i.e., higher packing density) of circuit components.

According to the invention, a method for making an integrated circuit includes forming spaced-apart trenches on a surface of a single crystal silicon substrate, lining the trenches and non-trenched areas with a silicon oxide layer, forming a first polysilicon layer over the silicon oxide layer, forming a second polysilicon layer over the first polysilicon layer, and removing a thickness of the single crystal silicon substrate to expose tubs of single crystal silicon in the second polysilicon layer. The first polysilicon layer and silicon oxide layer dielectrically isolate the single crystal silicon tubs from the second polysilicon layer. Furthermore, the first polysilicon layer reduces hole formation in the silicon oxide layer in subsequent processing steps and may significantly increase yield.

More specifically, the first polysilicon layer may be substantially coextensive with the silicon oxide layer. The first polysilicon layer may have a thickness in a range of about 0.02 $\mu$m to 0.5 $\mu$m and, more preferably, about 0.05 $\mu$m to 0.15 $\mu$m. Moreover, the first polysilicon layer may be formed using chemical vapor deposition or low pressure chemical vapor deposition, for example. The silicon oxide layer may be formed by thermal oxidation of the single crystal silicon substrate. Also, the silicon oxide layer may have a thickness in a range of about 0.2 $\mu$m to 5 $\mu$m and, more preferably, about 1 $\mu$m to 3 $\mu$m.

Additionally, the silicon oxide layer and the first polysilicon layer may extend between adjacent trenches on the second polysilicon layer, and the thickness of the silicon substrate may be removed to expose portions of the silicon oxide layer between adjacent single crystal silicon tubs. Alternatively, the thickness of the silicon substrate may be removed to a depth so that portions of the silicon oxide layer and first polysilicon layer are removed between adjacent single crystal silicon tubs.

Furthermore, the spaced-apart trenches may be formed by V-groove etching. Forming the spaced-apart trenches may also include forming a first set of parallel trenches and forming a second set of parallel trenches transverse to the first set of parallel trenches. Also, at least one circuit element may be formed on each of the single crystal silicon tubs. The method may also include forming an opening extending through the second polysilicon layer, the first polysilicon layer, and the silicon oxide layer to at least one of the single crystal silicon tubs. The first polysilicon layer may be formed at a first temperature and the second polysilicon layer may be formed at a second temperature greater than the first temperature of about 1000 to 1075° C., for example.

An integrated circuit according to the present invention includes a polysilicon substrate having a plurality of recesses therein, a silicon oxide layer lining the trenches, a first polysilicon layer over the silicon oxide layer, and a plurality of single crystal silicon tubs on the silicon oxide layer and filling the plurality of recesses.

DETAILED DESCRIPTION OF THE PREFERRED EMBODIMENTS

The present invention will now be described more fully hereinafter with reference to the accompanying drawings, in which preferred embodiments of the invention are shown. However, this invention may be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and other elements may be exaggerated in the figures for greater clarity.

Figure 1:
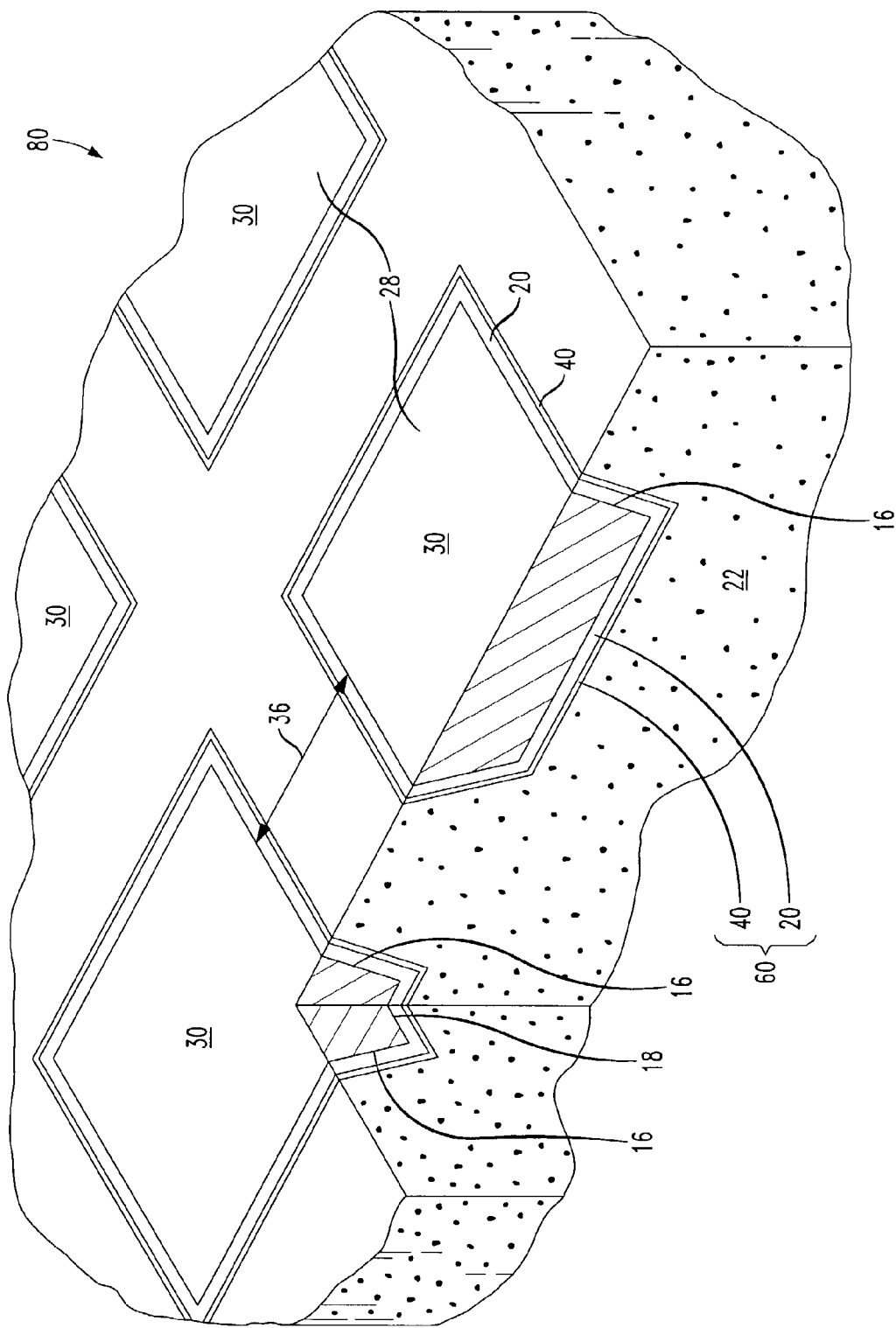
FIG. 1 is a perspective, partially sectioned view of a portion of an exemplary integrated circuit device showing dielectrically isolated tubs of silicon in accordance with the present invention.

An integrated circuit (IC) device 80 formed in accordance with the present invention is shown in FIG. 1 and has a dielectrically isolated (DI) substrate configuration useful in forming devices including bipolar devices and/or metal-oxide semiconductors (MOS). In such semiconductor devices, circuits are electrically isolated to prevent leakage between adjacent transistors and between transistors and other components. In the method of the present invention, the dielectric isolation barrier is a two-layer barrier including a first layer of oxide formed over the tub surface and covered by a nitride layer prior to deposition of a polysilicon layer or handle.

Figure 2:
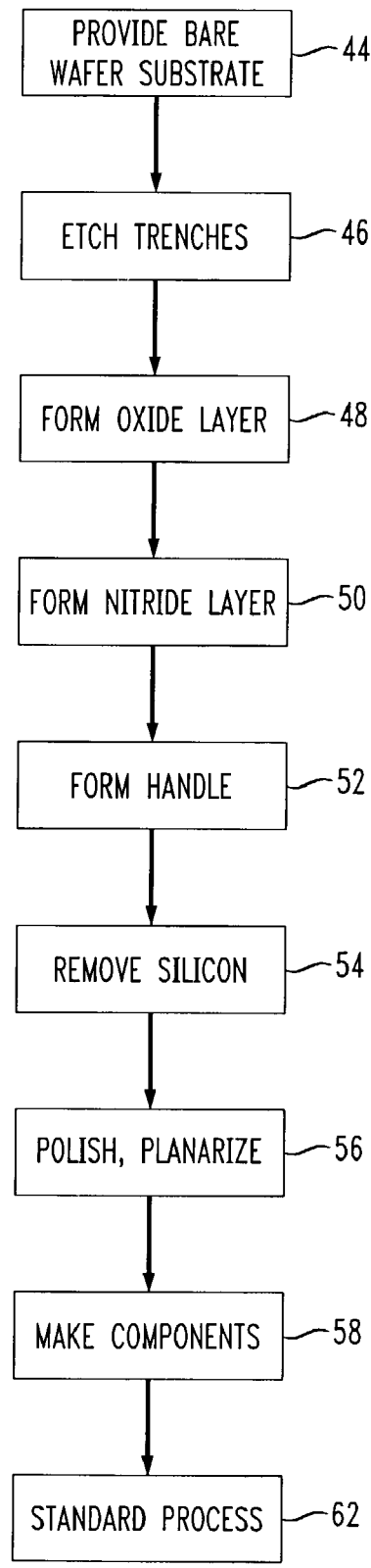
FIG. 2 is a flow chart illustrating a method of the present invention.

The method of the present invention is illustrated in the steps of FIG. 2, and views of the integrated circuit 80 at various stages of construction are shown in FIGS. 3–11. In these steps, a bare silicon substrate 10 is transformed into an integrated circuit 80 having spaced-apart dielectrically isolated tubs 30 containing electronic components 70. The numeral 80 will represent the integrated circuit following various steps of manufacture, irrespective of added and subtracted components. The method of the invention will be described as summarized in the steps shown in FIG. 2, taken in conjunction with FIGS. 3–12 which show the integrated circuit 80 following the described steps.

Figure 3:
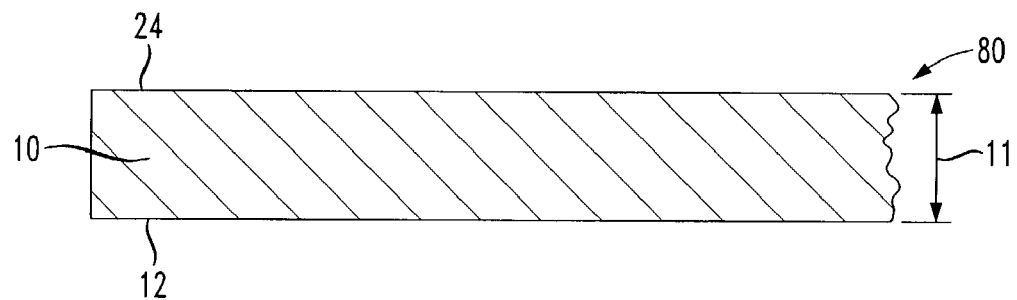
FIG. 3 is a cross-sectional view of a portion of a single-crystal substrate for application of the present invention.

A bare substrate 10 of FIG. 3 may be provided (FIG. 2, Block 44) by any appropriate method known in the art. For example, the substrate 10 is typically cut from a material of single crystal silicon (not shown) and may be subjected to primary flattening, polishing and surface oxidation steps as known in the art. The substrate 10 will have a first surface 12 and a second surface 24, with the first surface being specifically polished and planarized. The substrate 10 may optionally be subjected to a prior art oxidation treatment to provide a surface protective layer (not shown) of silicon dioxide, for example, although such oxidation is not a necessary step in the method of this invention.

Figure 4:
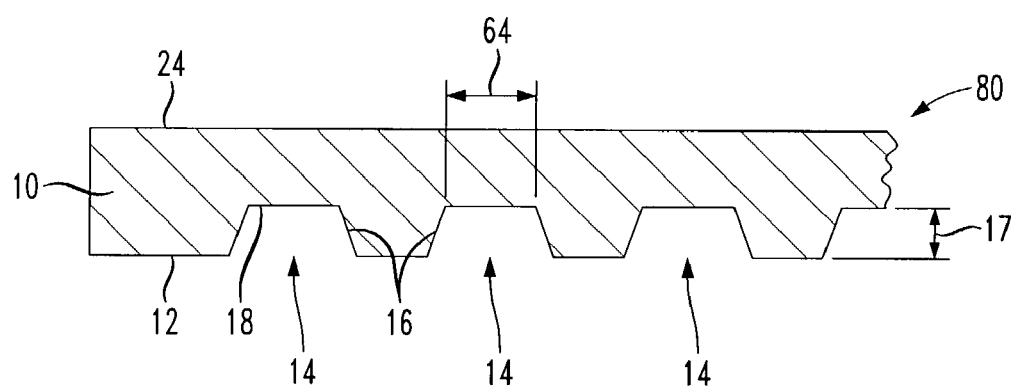
FIG. 4 is a cross-sectional view of the portion of the substrate of FIG. 3 following etching of trenches in a first substrate surface.

The substrate 10 is then etched by a V-groove etching process, for example, to form pockets or trenches 14 in the first substrate surface 12, as shown in FIG. 2, Block 46, and FIG. 4. The etching process may include an isotropic wet etch or an anisotropic dry etch, both of which are known in the art. The trenches 14 may be deep trenches, having a depth 17 which may include up to, and even more than, one half of the original substrate thickness 11, for example. The trench depth 17 may be any depth which will provide the desired physical configuration of the tubs 30 (see FIG. 8). The trenches 14 are formed as a first parallel set and a second set of parallel trenches transverse to one another (e.g., oriented at a right angles). Thus, the pattern of transverse trenches 14 is formed on the first planar substrate surface 12. The trenches 14 may be formed as shown in the figures, i.e., with a bottom surface 18 and side surfaces 16. Alternatively, the trenches 14 may have a V-shaped configuration, with only side surfaces 16.

Figure 5:
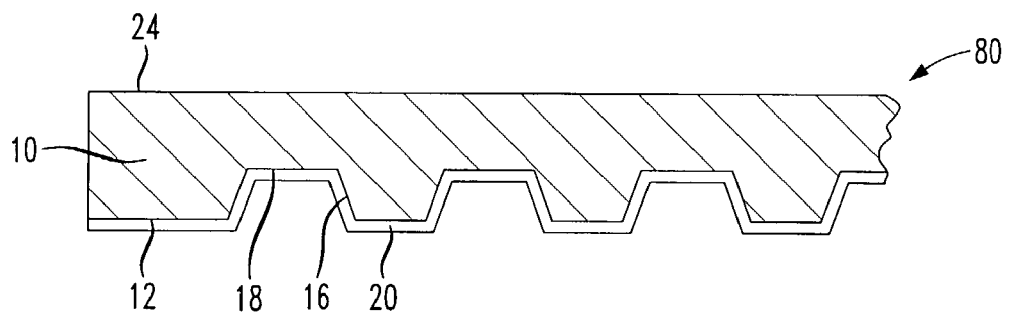
FIG. 5 is a cross-sectional view of a portion of the substrate of FIG. 4 following formation of an oxide layer on the trench surfaces and first substrate surface.

An oxide layer 20 is grown over the bottom surfaces 18 and side surfaces 16 of the trenches 14 and un-etched portions of the substrate surface 12, as shown in FIG. 2, Block 48 and FIG. 5. This oxide layer 20 has a thickness which may be in a range of about 0.5–5 $\mu$m, and preferably is at least the minimum thickness at which the desired isolation will be obtained. Of course, the thickness will depend upon the particular application of the packaged devices, the inter-tub separation distance 36, and other factors. An excessive thickness 38 may, however, limit subsequent coverage by a nitride layer or result in material waste. The layer 20 may be formed by thermal oxidation of the underlying silicon of the substrate 10, as known in the art, and covers the trench surfaces 16 and 18 as well as untrenched portions of the surface 12.

Figure 6:
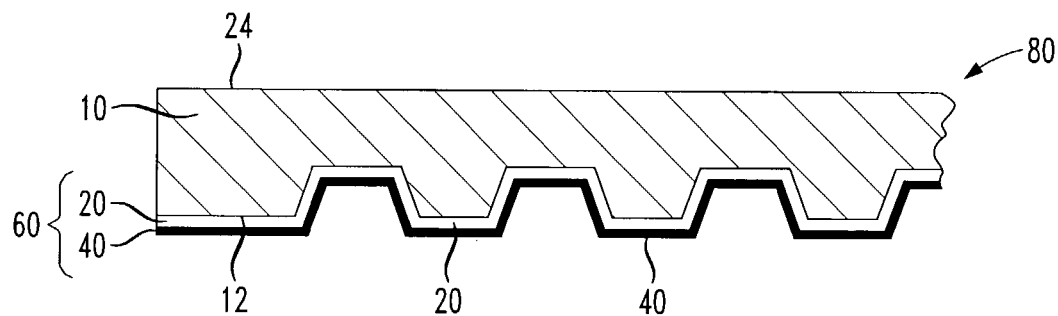
FIG. 6 is a cross-sectional view of a portion of the substrate of FIG. 5 following formation of a nitride layer on the oxide layer covering the trench surfaces and first substrate surface.

As shown in Block 50 of FIG. 2, together with FIG. 6, a thin nitride layer 40 is applied onto the oxide layer 20. The nitride layer 40 is preferably deposited as a conformal layer of $Si_3N_4$, although other suitable nitrides may be used as well. The nitride layer 40 may have a thickness 42 of about 0.05 $\mu$m to about 1 $\mu$m, for example. More preferably, the thickness may be about 0.05–0.15 $\mu$m. The nitride layer 40 may be applied by chemical vapor deposition. (CVD), low pressure chemical vapor deposition (LPCVD), or other suitable techniques.

The use of LPCVD to form layers 40 of nitride is well known in the art and may, for example, include depositing silicon nitride in a LPCVD reactor from a mixture of dichlorosilane (DCS) and a nitrogen containing a precursor such as ammonia. Typical reactor temperatures are in a range of about 950–1200° C. Again, other systems and methods which will deposit a thin nitride layer 40 over the oxide layer 20 may alternatively be used.

The silicon oxide layer 20 and the nitride layer 40 together form a dielectric isolation barrier 60. The nitride layer 40 reduces the initiation of defect (e.g., hole) formation in the oxide layer 20 by forming a barrier against contaminant particles that would otherwise contact with and react with the oxide. Elimination of hole defects in the oxide layer 20 improves the initial and long-term performance of components formed on/in the tubs 30, and enhances die yield. Also, use of the nitride layer 40 permits formation of the prior formed oxide layer 20 at a minimal thickness 38 when compared to the prior art. Thus, savings in oxidation expenditures may be realized.

Alternatively, a layer of polysilicon may be deposited in place of the nitride layer 40 to seal the oxide so that the high temperatures and hydrogen present in later processing steps cause the contaminant particles to react less with the oxide. This approach may be easier to implement in certain applications because deposition of the nitride layer 40 may involve moving wafers between different processing facilities. That is, the first polysilicon layer may be deposited in the same reactor and in the same manner used to deposit the second polysilicon layer or handle 22 (see FIG. 7), as described further below. Yet, the first polysilicon layer is preferably deposited at a lower temperature than the handle 22, e.g., about 1000 to 1075° C. (as opposed to an exemplary deposition temperature of about 1200 to 1250° C. for the handle 22).

Applicants' theorize, without wishing to be bound thereto, that the lower temperature reduces hole formation due to viscosity of the oxide layer 20 and results in a reduced reaction rate between the hydrogen and the contaminant particles. The first polysilicon layer may be about 1 to 10 $\mu$m thick, for example, which is sufficient to effectively seal the contaminants within the oxide layer 20 and prevent at least some of the hydrogen from reaching the oxide layer during subsequent processing steps. That is, the chance of holes forming under the contaminant particles is reduced.

Figure 7:
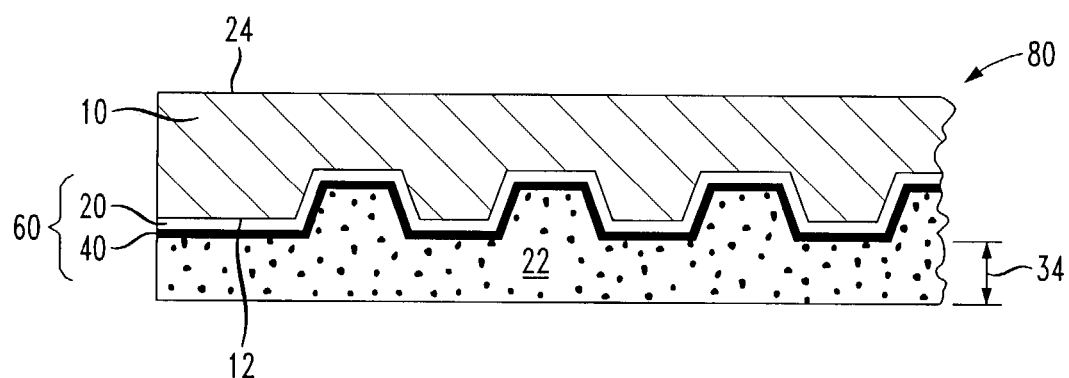
FIG. 7 is a cross-sectional view of a portion of the substrate of FIG. 6 showing a thick layer of polysilicon formed over the nitride layer to backfill the trenches and form a handle.

The next step of the integrated circuit formation is shown in FIG. 2, Block 52 and FIG. 7. A thick deposit 22 of polysilicon is formed over the nitride layer 40, which in this application will be referred to as a layer or "handle." This handle 22 may be formed by any applicable method. For example, a handle 22 having a thickness 34 of about 200 $\mu$m or more may be formed by well-known chemical vapor deposition (CVD) methods or by using a molten silicon spray deposition (MSSD).

Figure 8:
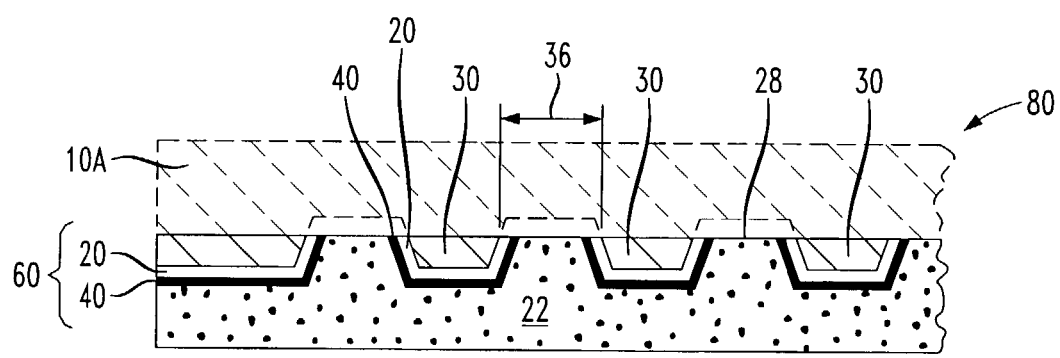
FIG. 8 is a cross-sectional view of a portion of polysilicon layer of FIG. 7 following removal of silicon down to the polysilicon below the nitride layer to create isolated tubs of the original silicon material within the polysilicon.
Figure 9:
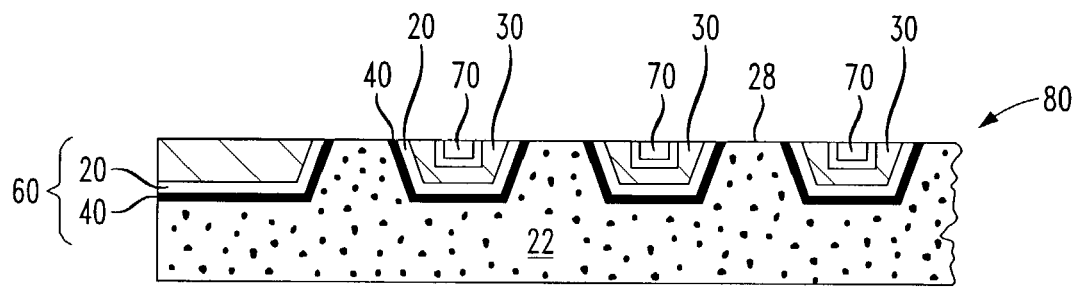
FIG. 9 is a cross-sectional view of a portion of the polysilicon layer of FIG. 8 following fabrication of electronic components in the single crystal silicon tubs.
Figure 10:
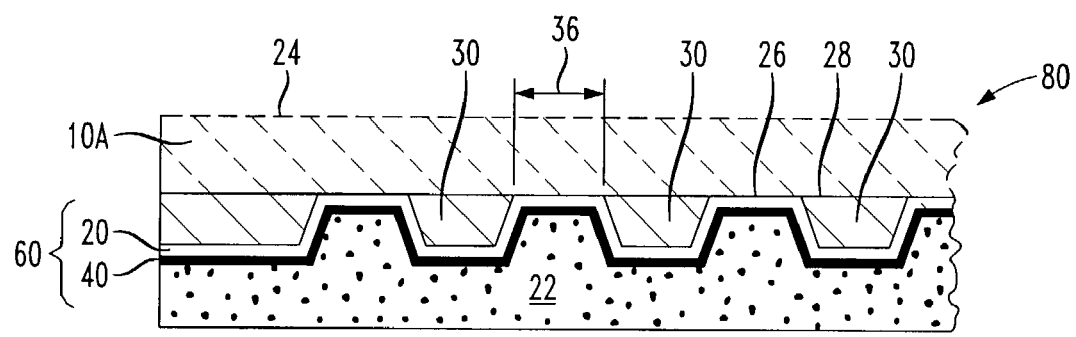
FIG. 10 is a cross-sectional view of a portion of the polysilicon layer of FIG. 7 following an alternative removal of silicon down to the oxide layer to create isolated tubs of the original silicon material within the polysilicon.
Figure 11:
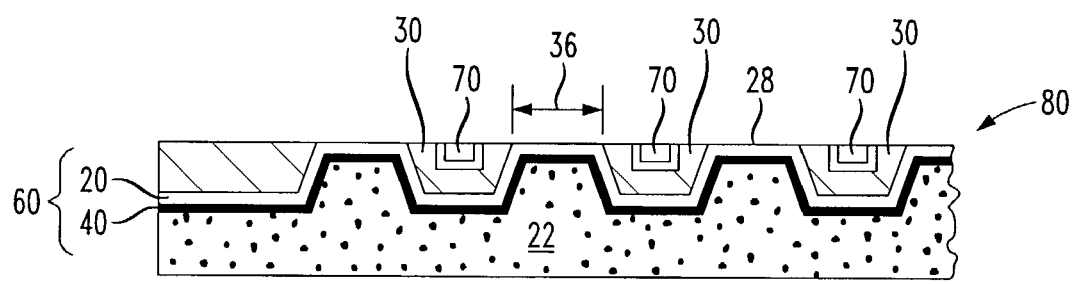
FIG. 11 is a cross-sectional view of a portion of the polysilicon layer of FIG. 10 following fabrication of electronic components in single crystal silicon tubs.

In a next step shown in FIG. 2, block 54, and FIG. 8, a portion 10A of the silicon in the original substrate 10 is removed by grinding, for example, to form an active surface 28. The active surface 28 may then be further planarized and polished (FIG. 2, Block 56, and FIG. 8) by a chemical-mechanical polishing (CMP) method including buffing or lapping with a pad and a slurry-etchant mixture, for example. As shown in FIG. 11, the original substrate 10 is lapped to form discrete spaced-apart single-crystal silicon tubs 30 which resemble islands in the polysilicon handle 22.

In this example, the two-part barrier 60 is shown as removed from the polysilicon handle 22 in areas surrounding the tubs 30, exposing the handle.

Electronic components 17 (FIG. 9) are then fabricated in/on the tubs 30. The components 70 may be bipolar or MOS transistors, diodes, resistors, capacitors, etc. This fabrication step (shown at Block 58 of FIG. 2) may use any suitable method known in the art, and depends upon the particular application of the final packaged device. The dielectric isolation of components 70 will be more reliable, inasmuch as defects in the isolation barrier 60 are substantially reduced or eliminated. Following the formation of the electronic components 70, including metallization, the substrate 80 is completed using standard processes (FIG. 6, Block 62), which typically include die singulation, packaging, and testing.

An alternative form of the silicon removal step (FIG. 2, Block 54) of the invention is shown in FIGS. 11 and 12, in which the silicon of substrate 10 is ground down to a level which exposes the silicon dioxide layer 20 or nitride layer 40 of the isolation barrier 60. In this embodiment, the portion of the active surface 26 which surrounds the single crystal silicon tubs 30 is covered with one or both parts of the dielectric isolation barrier 60. The intertub distance 36 is approximately equivalent to the trench width 64 (see FIG. 4). Thus, the packing density of electronic components 70 in the integrated circuits to be formed may be increased by reducing the trench width 64 in the trench etch step 46.

Many modifications and other embodiments of the invention will come to the mind of one skilled in the art having the benefit of the teachings presented in the foregoing descriptions and the associated drawings. Therefore, it is to be understood that the invention is not limited to the specific embodiments disclosed, and that the modifications and embodiments are intended to be included within the scope of the depending claims.

That which is claimed is:

1. An integrated circuit device, comprising:
    a single crystal silicon substrate having a component side and an opposing side and having a plurality of trenches formed on said opposing side;
    an isolation barrier layer lining said trenches;
    a first polysilicon layer located over said isolation barrier layer and within said trenches on said opposing side, wherein said first polysilicon layer reduces holes in said isolation barrier layer;
    a polysilicon handle layer located over said first polysilicon layer and within said trenches on said opposing side; and
    a circuit component located over and formed within said component side.

2. The integrated circuit according to claim 1 wherein said isolation barrier layer is a stacked barrier layer and one layer of said stack comprises oxide.

3. The integrated circuit according to claim 2 wherein said oxide layer is silicon dioxide.

4. The integrated circuit according to claim 3 wherein said silicon dioxide layer has a thickness in a range of about 0.2 $\mu$m to 5 $\mu$m.

5. The integrated circuit according to claim 4 wherein said silicon dioxide layer has a thickness in a range of about 1 $\mu$m to 3 $\mu$m.

6. The integrated circuit according to claim 1 wherein said first polysilicon layer is a low temperature polysilicon layer.

7. The integrated circuit according to claim 6 wherein said isolation barrier layer further comprises a silicon nitride layer.

8. The integrated circuit according to claim 1 wherein said first polysilicon layer has a thickness in a range of about 0.02 $\mu$m to 0.5 $\mu$m.

9. The integrated circuit according to claim 8 wherein said polysilicon layer has a thickness in a range of about 0.05 m to 0.15 $\mu$m.

10. The integrated circuit according to claim 1 wherein said polysilicon handle layer has a thickness of about 200 $\mu$m.

11. The integrated circuit according to claim 1 wherein said circuit components are transistors.

* * * * *